(12) United States Patent
Ochiai et al.

(10) Patent No.: US 9,397,633 B2
(45) Date of Patent: Jul. 19, 2016

(54) ACOUSTIC WAVE DEVICE

(75) Inventors: Hiroaki Ochiai, Kyoto (JP); Junya Nishii, Kyoto (JP); Tsuyoshi Nakai, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 834 days.

(21) Appl. No.: 13/521,816

(22) PCT Filed: Jan. 12, 2011

(86) PCT No.: PCT/JP2011/050351
§ 371 (c)(1),
(2), (4) Date: Sep. 7, 2012

(87) PCT Pub. No.: WO2011/087018
PCT Pub. Date: Jul. 21, 2011

(65) Prior Publication Data
US 2012/0319802 A1 Dec. 20, 2012

(30) Foreign Application Priority Data
Jan. 12, 2010 (JP) .................................. 2010-003855

(51) Int. Cl.
*H03H 9/64* (2006.01)
*H03H 9/10* (2006.01)
(Continued)

(52) U.S. Cl.
CPC ............... *H03H 9/1092* (2013.01); *H03H 3/02* (2013.01); *H03H 9/64* (2013.01); *H03H 9/6489* (2013.01); *H03H 9/0038* (2013.01); *H03H 9/02992* (2013.01)

(58) Field of Classification Search
CPC ... H03H 9/6483; H03H 9/02842; H03H 9/64; H03H 9/6489; H03H 9/1092; H03H 9/0038; H03H 9/02992; H03H 3/02

USPC .......................................... 333/193, 195, 133
See application file for complete search history.

(56) References Cited

U.S. PATENT DOCUMENTS

| | | | | |
|---|---|---|---|---|
| 7,385,463 | B2 * | 6/2008 | Koga .................. | H03H 9/0576 333/133 |
| 7,629,866 | B2 * | 12/2009 | Kadota .................. | H03H 3/08 333/133 |

(Continued)

FOREIGN PATENT DOCUMENTS

| JP | 2004-147220 | * | 5/2004 |
|---|---|---|---|
| JP | 2004-336671 | * | 11/2004 |

(Continued)

OTHER PUBLICATIONS

English Translation of WO 2009-116222 A1—Dec. 30, 2010.*

(Continued)

*Primary Examiner* — Barbara Summons
(74) *Attorney, Agent, or Firm* — Procopio, Cory, Hargreaves & Savitch LLP (57) ABSTRACT

A SAW device (1) comprises a substrate (3); SAW elements (10) on a first main surface (3a) of the substrate (3); first lines (intermediate lines (29) and output side lines (31)) that are disposed upon the first main face (3a) and connected to the SAW elements (10); an insulator (21) that is layered upon the first lines; second lines (a second ground line (33b) and a third ground line (33c)) that are layered upon the insulator (21) and configure three-dimensional wiring parts (39) with the first lines; and a cover (5) that seals the SAW elements (10) and the three-dimensional wiring parts (39). Wiring spaces (53), formed between the first main face (3a) and the cover (5), houses the three-dimensional wiring parts (39), without housing the SAW elements (10).

27 Claims, 10 Drawing Sheets (51) Int. Cl.
*H03H 3/02* (2006.01)
*H03H 9/00* (2006.01)
*H03H 9/02* (2006.01)

(56) References Cited

U.S. PATENT DOCUMENTS

| | | | |
|---|---|---|---|
| 2006/0192462 A1* | 8/2006 | Iwamoto | H03H 9/1092 310/348 |
| 2007/0252481 A1 | 11/2007 | Iwamoto et al. | |
| 2007/0290770 A1 | 12/2007 | Otsuka et al. | |
| 2008/0204167 A1 | 8/2008 | Takamine | |
| 2009/0261921 A1 | 10/2009 | Moriya et al. | |
| 2010/0060372 A1* | 3/2010 | Funahashi et al. | 333/5 |
| 2010/0219912 A1 | 9/2010 | Tanaka et al. | |
| 2011/0102108 A1 | 5/2011 | Fukuda | |

FOREIGN PATENT DOCUMENTS

| | | | |
|---|---|---|---|
| JP | 2005-210475 A | | 8/2005 |
| JP | 2005-223432 | * | 8/2005 |
| JP | 2005-223809 A | | 8/2005 |
| JP | 2006-203788 | * | 8/2006 |
| JP | 2006-333130 A | | 12/2006 |
| JP | 2007-300604 A1 | | 11/2007 |
| JP | 2008-028826 A | | 2/2008 |
| JP | 2008-85620 | * | 4/2008 |
| JP | 2009-206688 A | | 9/2009 |
| WO | 2006/106831 A1 | | 12/2006 |
| WO | 2006/134928 A1 | | 12/2006 |
| WO | 2007/055077 A1 | | 5/2007 |
| WO | 2008/146552 A1 | | 12/2008 |
| WO | 2009/013974 A1 | | 1/2009 |
| WO | 2009-116222 A1 | * | 9/2009 |
| WO | 2009/116222 A1 | | 9/2009 |
| WO | 2009/150786 A1 | | 12/2009 |

OTHER PUBLICATIONS

Office Action dated Nov. 12, 2013, issued in counterpart Japanese application No. 2011-549987.

International Search Report dated Mar. 22, 2011, issued for International Application No. PCT/JP2011/050351.

* cited by examiner

ACOUSTIC WAVE DEVICE

TECHNICAL FIELD

The present invention relates to an acoustic wave device such as a surface acoustic wave (SAW) device, a film bulk acoustic resonator (FBAR), or the like.

BACKGROUND ART

An acoustic wave device having a piezoelectric substrate, acoustic wave elements which are provided on the piezoelectric substrate, and a cover for sealing the acoustic wave elements is known. In the narrow sense of a SAW device, between the piezoelectric substrate and the cover, an oscillation space for housing the acoustic wave elements is formed in order to facilitate oscillation of the acoustic wave elements. Patent Literature 1 discloses an acoustic wave device in which two oscillation spaces are formed.

On the piezoelectric substrate, a plurality of lines connected to the acoustic wave elements are provided as well. The plurality of lines have portions formed thicker than the thickness of the acoustic wave element. If a cover is laid over such relatively thick portions, a gap is liable to form between the substrate and the cover and the cover is liable to easily peel off from the substrate.

Accordingly, preferably there is provided a high reliability acoustic wave device capable of suppressing peeling of the cover from the substrate and formation of a gap between the cover and the substrate even in a case where thick portions is provided at the lines.

CITATIONS LIST

Patent Literature

Patent Literature 1: International Patent Publication No. WO2006/106831 pamphlet

SUMMARY OF INVENTION

An acoustic wave device of one aspect of the present invention has a substrate, an acoustic wave element on a main surface of the substrate, a first line which is located on the main surface and which is connected to the acoustic wave element, an insulator on the first line, a second line which is located on the insulator and which has at least one three-dimensional wiring part which crosses three-dimensionally the first line with the insulator, and a cover which seals the acoustic wave element and the three-dimensional wiring part with the main surface, wherein a wiring space housing the three-dimensional wiring part is located between the main surface and the cover.

According to the acoustic wave device configured as described above, even in a case where the three-dimensional wiring part which become thicker than the acoustic wave element is provided, an wiring space which houses the three-dimensional wiring part is formed between the main surface of the piezoelectric substrate and the cover, therefore the cover is not laid over the thick three-dimensional wiring part, so peeling of the cover from the substrate or formation of a gap between the substrate and the cover can be suppressed.

BRIEF DESCRIPTION OF DRAWINGS

[FIG. 5]

[FIG. 6]

[FIG. 7]

DESCRIPTION OF EMBODIMENTS

Below, surface acoustic wave devices (SAW devices) according to embodiments of the present invention will be explained with reference to the drawings. Note that, the drawings which are used in the following explanation are diagrammatical ones. The dimensional ratios etc. on the drawings do not necessarily match with the actual ones.

Further, in the second and following embodiments, the same or similar configurations as those in the already explained embodiments will sometimes be assigned the same reference signs as those in the already explained embodiments. Further, the explanations will be sometimes omitted.

The reference signs for the same or similar configurations will sometimes have capital letters attached such as "the first terminal 7A to sixth terminal 7F". Further, in this case, sometimes the ordinal number of the term and the above additional notation will be omitted, for example, like "the terminals 7".

<First Embodiment>
(Configuration of SAW Device)

Figure 1:
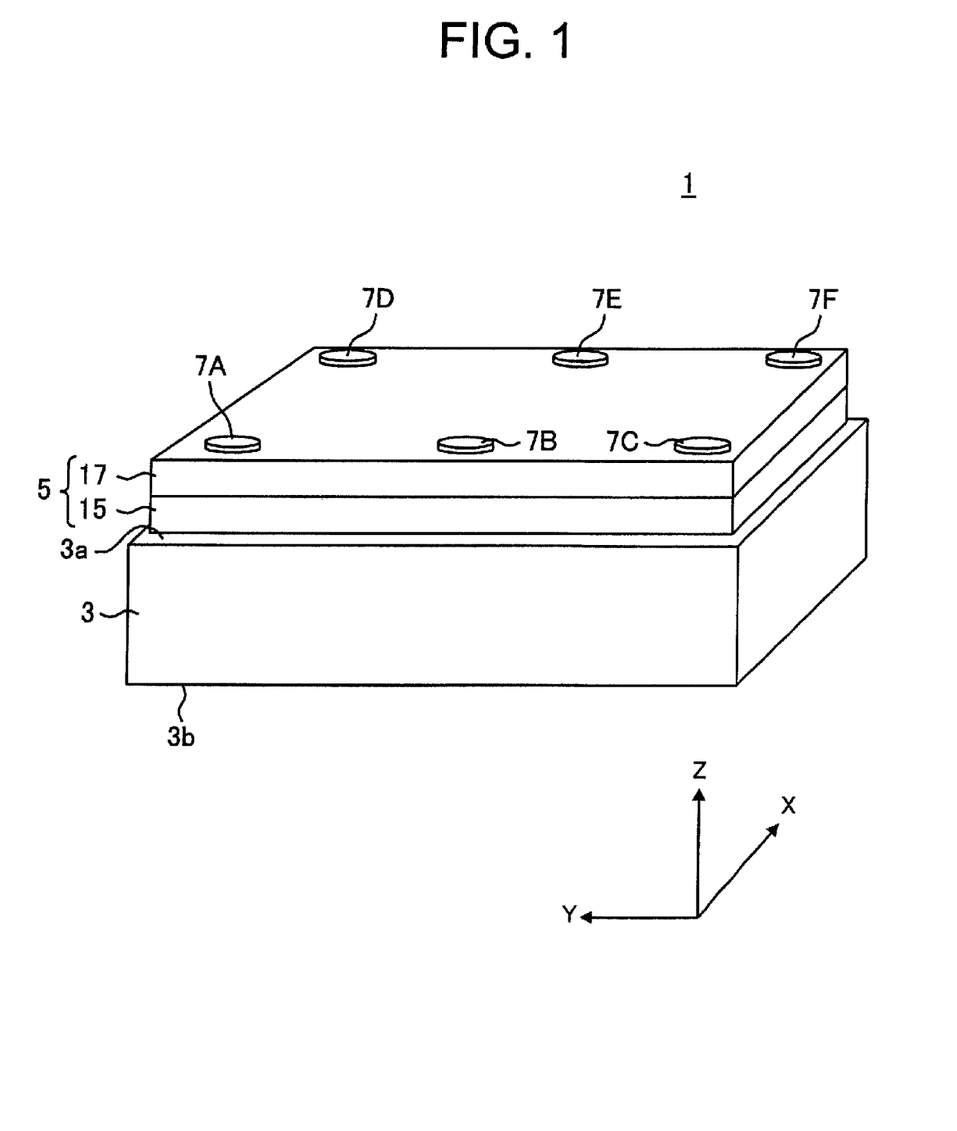
[FIG. 1] A perspective view of an appearance of a SAW device according to a first embodiment of the present invention.

FIG. 1 is a perspective view of an appearance of a SAW device 1 according to a first embodiment of the present invention.

The SAW device 1 is configured by a so-called wafer level package (WLP) type of SAW device. The SAW device 1 has a substrate 3, a cover 5 which is fastened to the substrate 3, and a first terminal 7A to sixth terminal 7F which are exposed from the cover 5.

The SAW device 1 receives as input a signal through any of the plurality of terminals 7. The input signal is filtered by the SAW device 1. Then, the SAW device 1 outputs the filtered signal through any of the plurality of terminals 7. The SAW device 1 is for example turned to make the surface on the cover 5 side face the mounting surface of a not shown circuit board or the like to place it on that mounting surface and in that state sealed by a resin so as to thereby connect the terminals 7 to the mounting surface.

The substrate 3 is configured by a piezoelectric substrate. Specifically, for example, the substrate 3 is a lithium tantalite single crystal, lithium niobate single crystal, or other block-shaped single crystal substrate having a piezoelectric property. The substrate 3 has a first main surface 3a and a second main surface 3b on the back surface side of the same. The planar shape of the substrate 3 may be suitably set, but for example is a rectangle having a predetermined direction (Y-direction) as the longitudinal direction. The size of the substrate 3 may be suitably set, but, for example, the thickness is 0.2 mm to 0.5 mm, and the length of one side is 0.5 mm to 2 mm.

The cover 5 is provided so as to cover the first main surface 3a. The planar shape of the cover 5 is for example same as the planar shape of the substrate 3. In the present embodiment, it is a shape like a rectangle that the longitudinal direction thereof is the Y-direction. The cover 5 has for example a generally equal area as that of the first main surface 3a and covers generally the entire surface of the first main surface 3a.

The plurality of terminals 7 are exposed from the top surface of the cover 5 (the surface on the side opposite to the substrate 3). The number and positions of arrangement of the plurality of terminals 7 are suitably set in accordance with the configuration of the electronic circuit inside of the SAW device 1. In the present embodiment, six terminals 7 are arranged along the outer circumference of the cover 5.

Figure 2:
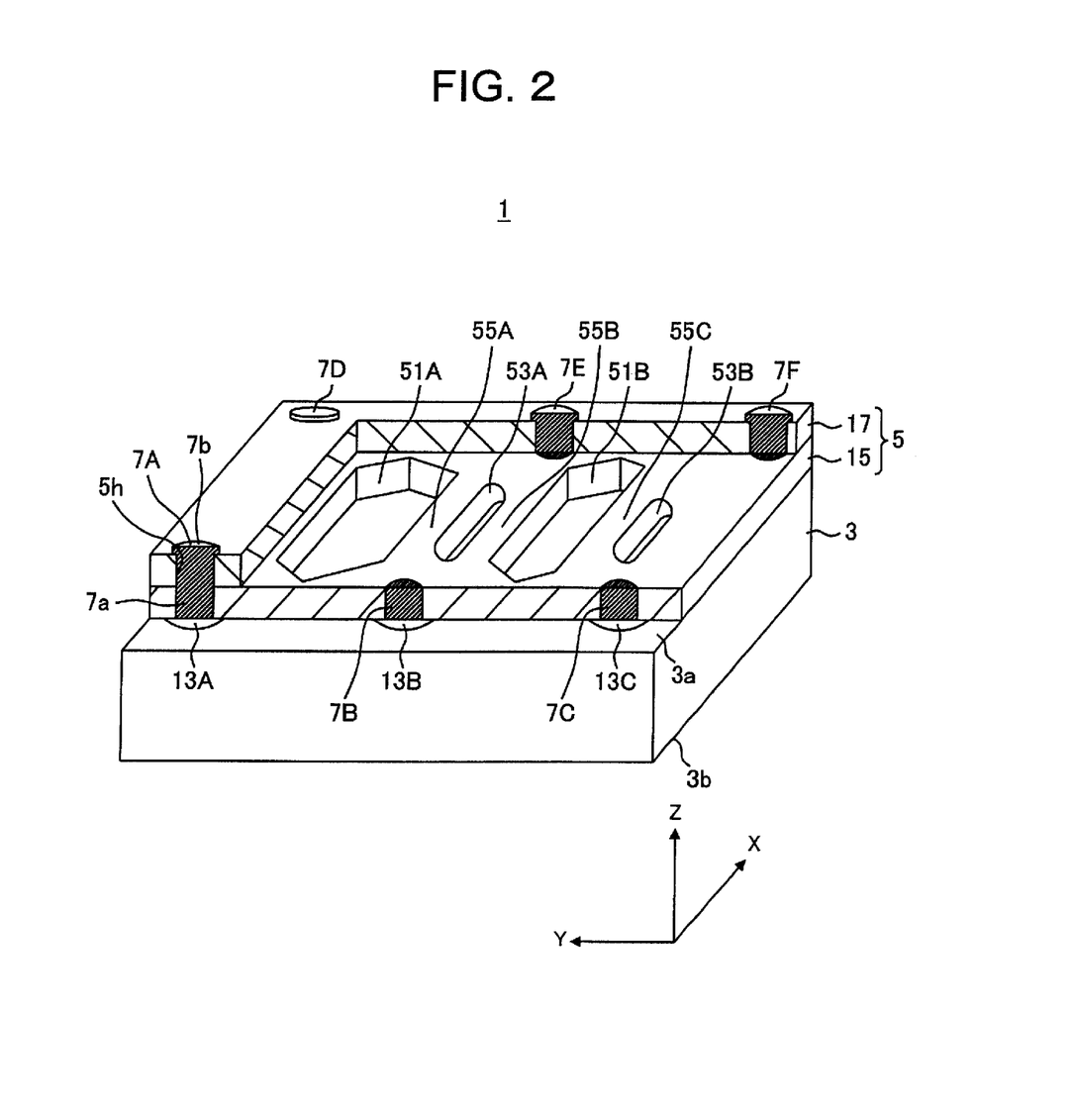
[FIG. 2] A schematic perspective view of the SAW device of FIG. 1 shown partially cut away.

FIG. 2 is a perspective view of the SAW device 1 shown by partially cutting away the cover 5.

The cover 5 has a frame 15 which is laid over the first main surface 3a and a lid 17 which is laid over the frame 15. The frame 15 is formed with plurality of openings. By the openings being closed by the lid 17, between the first main surface 3a and the cover 5, a first oscillation space 51A, a second oscillation space 51B, a first wiring space 53A, and a second wiring space 53B are formed.

The frame 15 is configured by a layer having a substantially constant thicknesses. The thickness of the frame 15 (height of the oscillation space 51 and wiring space 53) is for example several micrometers to 30 μm. The lid 17 is formed by a layer having a substantially constant thickness. The thickness of the lid 17 is for example several micrometers to 30 μm.

The frame 15 and lid 17 are formed by for example a photosensitive resin. The photosensitive resin is for example an urethane acrylate-based, polyester acrylate-based, or epoxy acrylate-based resin which is cured by radical polymerization of an acryl group or methacryl group etc.

The frame 15 and lid 17 may be formed by the same material or formed by materials which are different from each other. In the present application, for convenience of explanation, a borderline between the frame 15 and the lid 17 is clearly shown, but in an actual product, the frame 15 and the lid 17 may be formed by the same material and formed integrally.

The terminals 7 are provided standing up from the first main surface 3a and are exposed at the top surface of the cover 5 via through holes 5h which are formed in the cover 5. Each terminal 7 has a columnar section 7a obtained by filling in a through hole 5h and a land 7b which is exposed from the through hole 5h. The land 7b has a flange which is laid over the top surface of the cover 5.

Figure 3:
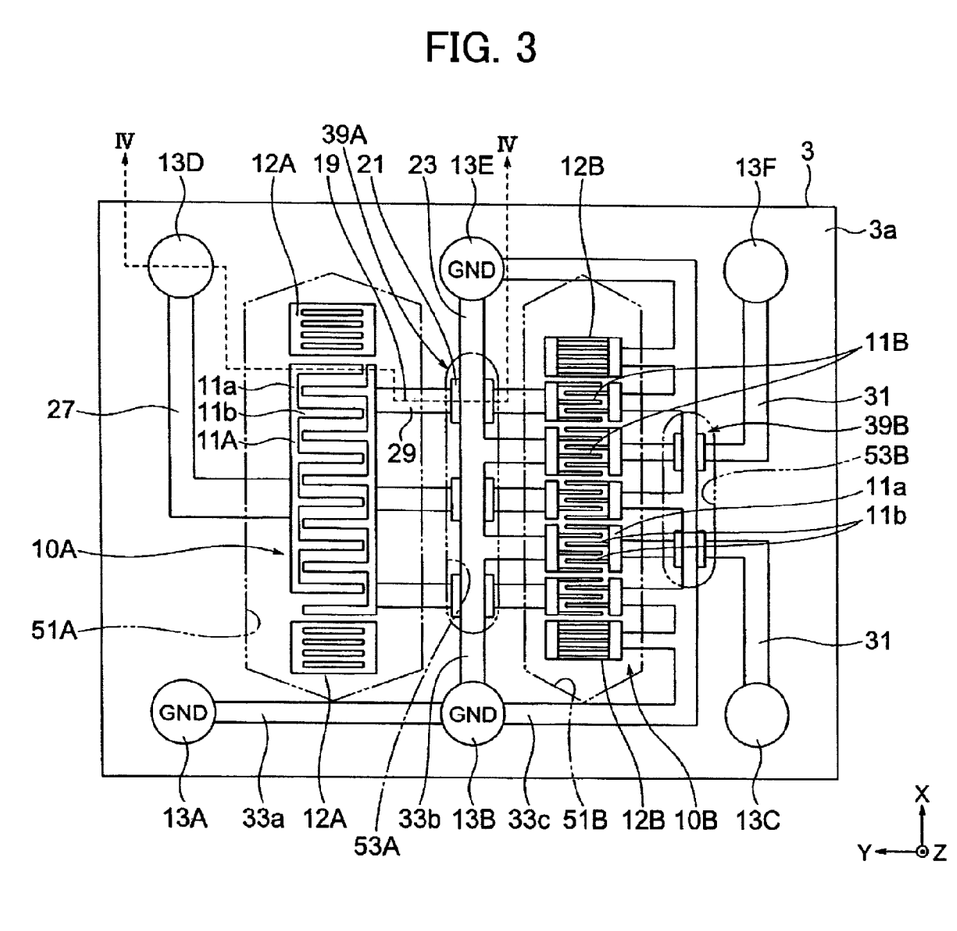
[FIG. 3] A diagrammatical plan view which shows an wiring structure in the SAW device in FIG. 1.

FIG. 3 is a diagrammatical plan view showing the wiring structure at the first main surface 3a of the substrate 3. Note that, in FIG. 3, the regions of the oscillation spaces 51 and the wiring spaces 53 are indicated by two-dot chain lines.

On the first main surface 3a, in order to filter signals, a SAW resonator 10A and a SAW filter 10B (hereinafter referred to as "SAW elements 10", these sometimes not differentiated) are provided.

The SAW resonator 10A has for example an IDT (interdigital transducer) electrode 11A and two reflectors 12A which are arranged at the two sides of the IDT electrode 11A in the propagation direction of the surface acoustic wave (X-direction).

The SAW filter 10B is configured by for example a cascade-connected double mode SAW filter. That is, the SAW filter 10B has a plurality of (for example five) IDT electrodes 11B and two reflectors 12B which are arranged on the two sides of the plurality of IDT electrodes 11B in the propagation direction of the surface acoustic wave (X-direction).

Each IDT electrode 11 is configured by a pair of electrodes. This pair of electrodes has bus bars 11a extending in the propagation direction of the surface acoustic wave (X-direction) and a plurality of electrode fingers 11b extending from the bus bars 11a in a direction (Y-direction) perpendicular to the above propagation direction and is arranged so that the electrode fingers 11b mesh with each other. Note that, FIG. 3 is a diagrammatical view, therefore the electrode fingers 11b are shown in a smaller number than the actual number.

Further, on the first main surface 3a, a first pad 13A to sixth pad 13F which are connected to the first terminal 7A to the sixth terminal 7F are provided. The pads 13 are provided right under the terminals 7.

Further, on the first main surface 3a, a plurality of lines (27 etc.) for connecting the SAW elements 10 and the pads 13 to each other are provided. The wiring structure may be a suitable configuration in accordance with positions, structures, etc. of the terminals 7 and SAW elements 10. FIG. 3 illustrates a wiring structure configured as follows.

The fourth terminal 7D is a terminal receiving as input a signal and is connected to the SAW resonator 10A by an input side line 27. The SAW resonator 10A and the SAW filter 10B are connected to each other by three intermediate lines 29. The third terminal 7C and the sixth terminal 7F are terminals outputting signals and are connected to the SAW filter 10B by two output side lines 31.

The first terminal 7A, second terminal 7B, and fifth terminal 7E are for example terminals given a reference potential. They are connected to each other and are connected to the SAW filter 10B.

Specifically, the first terminal 7A and the second terminal 7B are connected by a first ground line 33a. The second terminal 7B and the fifth terminal 7E are connected by a second ground line 33b. The second ground line 33b is branched at two locations, and those branched portions are connected to the SAW filter 10B. Further, the second terminal 7B and the fifth terminal 7E are connected by a third ground line 33c. The third ground line 33c is branched at three locations, and those branched portions are connected to the SAW filter 10B.

Here, the plurality of intermediate lines 29 and the second ground line 33b cross each other three-dimensionally with the insulator 21 interposed therebetween and form a plurality of first three-dimensional wiring parts 39A. In the same way, the plurality of output side lines 31 and the third ground line 33c cross each other three-dimensionally with the insulator 21 interposed therebetween and configure a plurality of second three-dimensional wiring parts 39B. The thicknesses of the three-dimensional wiring parts become larger than the thicknesses of the SAW elements 10.

The plurality of first three-dimensional wiring parts 39A are positioned relative to the SAW resonator 10A and SAW filter 10B at the side of the propagation direction of the acoustic wave (i.e., Y-direction). A plurality of these units are provided along the propagation direction (X-direction). In other words, the plurality of first three-dimensional wiring parts 39A are arranged beside the SAW resonator 10A in the direction perpendicular to the propagation direction of the acoustic wave of the SAW resonator 10A. In the same way, a plurality of second three-dimensional wiring parts 39B are positioned relative to the SAW filter 10B at the side of the propagation direction of the acoustic wave. A plurality of these units are provided along the propagation direction.

The oscillation spaces 51 house the SAW elements 10, but do not house the three-dimensional wiring parts 39. Further, the wiring spaces 53 do not house the SAW elements 10, but house the three-dimensional wiring parts 39. That is, the oscillation spaces 51 and the wiring spaces 53 are isolated from each other. In other words, the SAW elements 10 and the three-dimensional wiring parts 39 are housed in different spaces.

Specifically, the first oscillation space 51A houses the SAW resonator 10A, and the second oscillation space 51B houses the SAW filter 10B. The first wiring space 53A houses the plurality of first three-dimensional wiring parts 39A together, and the second wiring space 53B houses the plurality of second three-dimensional wiring parts 39B together.

Each oscillation space 51 is for example formed in a shape like a rectangle that the longitudinal direction thereof is the propagation direction of the SAW (X-direction). Further, each oscillation space 51 is formed in a hexagonal shape. The wiring space 53 is for example formed in a shape like a rectangle that the longitudinal direction thereof is the propagation direction of the SAW (X-direction). Further, the wiring space 53 is formed in an elliptical (oval) shape. In other words, the wiring spaces 53 are formed so that their ends in the longitudinal direction are semicircular in shape.

The first oscillation space 51A, the first wiring space 53A, the second oscillation space 51B, and the second wiring space 53B are arranged in that order in the direction perpendicular to the propagation direction of the SAW (i.e., Y-direction, the longitudinal direction of the cover 5, and short direction of the spaces).

The oscillation spaces 51 and the wiring spaces 53 are partitioned by a first main partition wall 55A to third main partition wall 55C (FIG. 2) each interposed between two spaces and are air-tightly cut off from each other. In other words, the oscillation spaces 51 and the wiring spaces 53 are individually sealed. The main partition walls 55 extend in the propagation direction of the SAW (X-direction, short direction of the cover 5, and longitudinal direction of the spaces).

Figure 4:
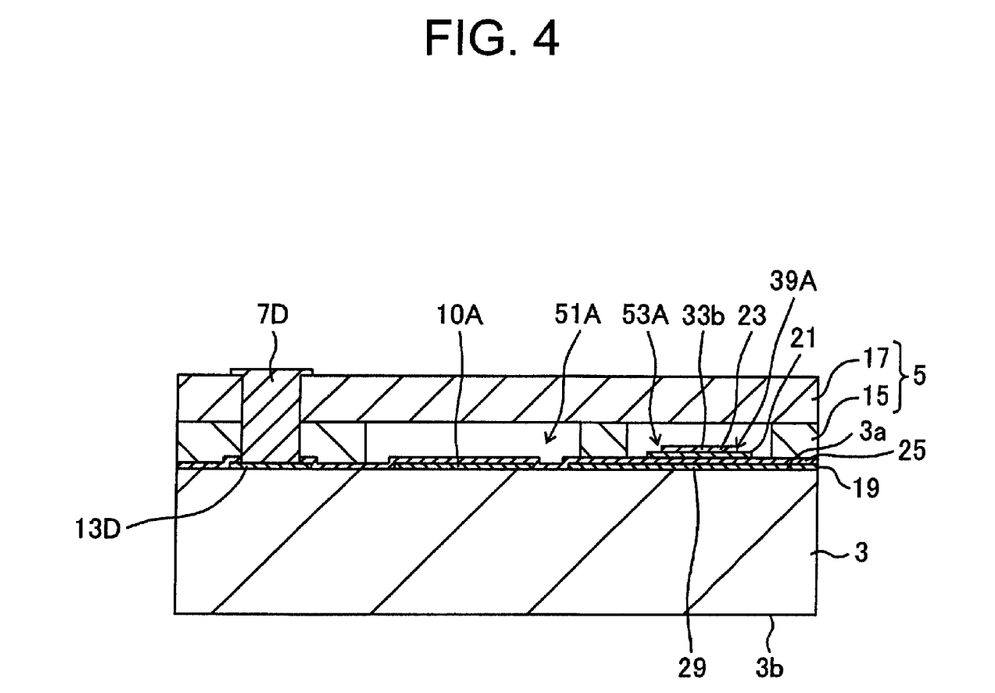
[FIG. 4] A cross-sectional view taken along the IV-IV line in FIG. 3.

FIG. 4 is a cross-sectional view taken along the IV-IV line in FIG. 3.

On the first main surface 3a, a first conductive layer 19, protective layer 25, insulator 21, and second conductive layer 23 are laid in that order.

The first conductive layer 19 is the layer which becomes the base member for the components on the first main surface 3a such as the circuit elements, the lines, or the like. Specifically, the first conductive layer 19 configures the SAW elements 10, pads 13, input side line 27, intermediate lines 29, output side lines 31, and first ground line 33a. The first conductive layer 19 is formed by for example an Al alloy such as an Al—Cu alloy or the like. Its thickness is for example 100 nm to 200 nm.

The insulator 21 is arranged between the lines three-dimensionally crossing as explained above. The insulator 21 is formed by for example a photosensitive resin (for example, a polyimide). Its thickness is for example 1 μm to 3 μm.

The second conductive layer 23 is a layer that is laid over the first conductive layer 19 with the insulator 21 interposed therebetween at places where lines given different potentials must three-dimensionally intersect and configures portions of the lines. Specifically, the second conductive layer 23 configures the second ground line 33b and third ground line 33c. The second conductive layer 23 is formed by for example gold, nickel, or chromium. The second conductive layer 23 is for example formed thicker than the first conductive layer 19 so as not to cause disconnection due to step differences caused by the insulator 21. Its thickness is for example 1 μm to 2 μm.

The protective layer 25 contributes to prevention of oxidation etc. of the SAW elements 10. The protective layer 25 is for example formed by a material having an insulation property. For example, the protective layer 25 is formed by a silicon oxide ($SiO_2$ etc.), silicon nitride, silicone, or the like. The thickness of the protective layer 25 is for example about 1/10 of the thickness of the first conductive layer 19 (i.e., 10 nm to 30 nm) or equal to or greater than the thickness of the first conductive layer 19 (i.e., 100 nm to 300 nm).

(Method of Production of SAW Device)

FIG. 5(a) to FIG. 7(c) are cross-sectional views corresponding to FIG. 4 for explaining the method of production of the SAW device 1. The production process proceeds in order from FIG. 5(a) to FIG. 7(c).

The process which will be explained below is realized in a so-called wafer process. That is, thin film formation, photolithography, etc. are carried out on a mother board which becomes the substrates 3 by being later divided. After that, by dicing, a large number of the SAW devices 1 are formed in parallel. However, in FIG. 5(a) to FIG. 7(c), only the portion corresponding to one SAW device 1 is shown. Further, the conductive layer, insulation layer, etc. change in shape along with progress of the process, but common reference signs are used before and after the change.

Figure 5A:
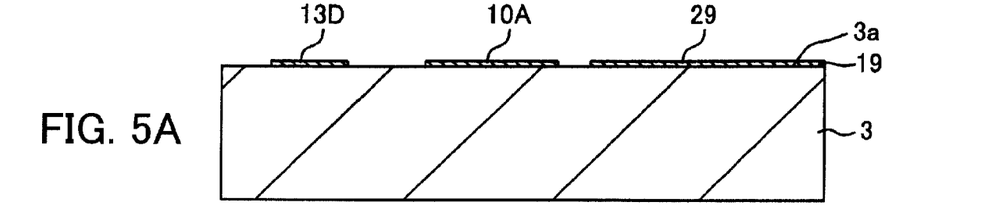
FIG. 5(a) to FIG. 5(d) are cross-sectional views corresponding to FIG. 4 for explaining a method of production of the SAW device in FIG. 1.

As shown in FIG. 5(a), first, on the first main surface 3a of the substrate 3, a first conductive layer 19 is formed. Specifically, first, by a thin film forming method such as a sputtering method, a vapor deposition method, a CVD (chemical vapor deposition) method or the like, a metal layer which becomes the first conductive layer 19 is formed on the first main surface 3a. Next, the metal layer is patterned by photolithography or the like using a reduced projection exposure apparatus (stepper) and RIE (reactive ion etching) apparatus. By the patterning, the SAW elements 10, pads 13, input side line 27, intermediate lines 29, output side lines 31, and first ground line 33a are formed. That is, the first conductive layer 19 is formed.

Figure 5B:
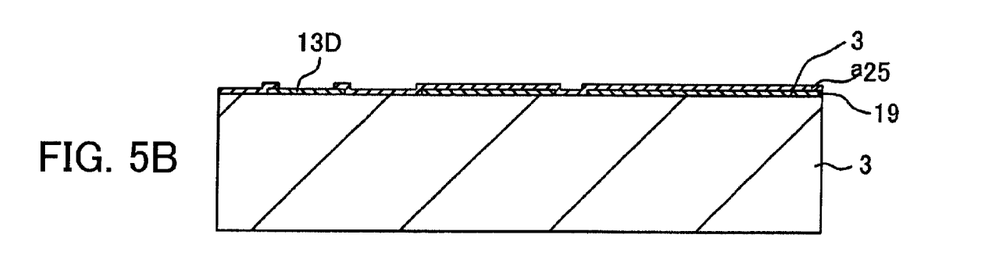

After the first conductive layer 19 is formed, as shown in FIG. 5(b), the protective layer 25 is formed. Specifically, first, by the thin film forming method such as the CVD method, vapor deposition method or the like, a thin film which becomes the protective layer 25 is formed. Next, portions of the thin film are removed by photolithography so that the portions configuring the pads 13 in the first conductive layer 19 are exposed. Thus the protective layer 25 is formed.

Figure 5C:
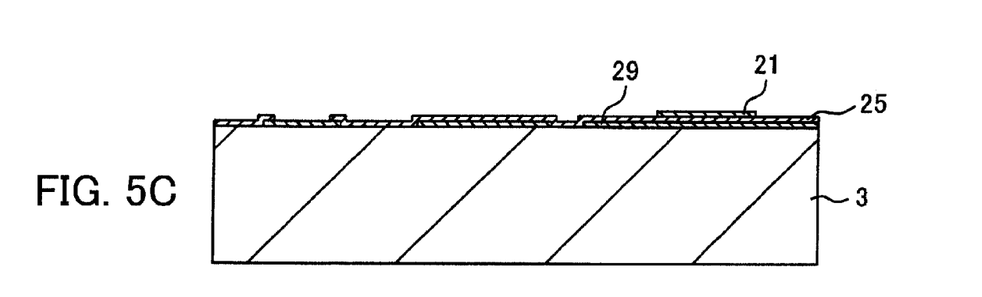

After the protective layer 25 is formed, as shown in FIG. 5(c), the insulator 21 is formed. Specifically, first, a thin film which becomes the insulator 21 is formed by thin film forming method such as the CVD method, the vapor deposition method or the like. Then, while leaving intact the regions which become the three-dimensional wiring parts 39, portions of the thin film are removed by photolithography.

Figure 5D:
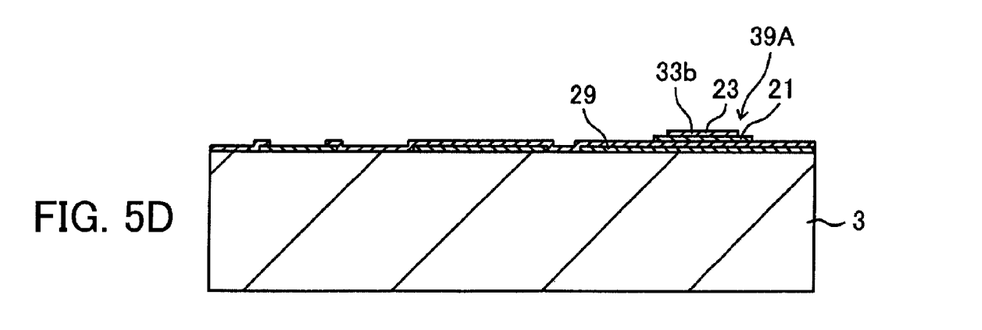

After the insulator 21 is formed, as shown in FIG. 5(d), the second conductive layer 23 is formed. Specifically, in the same way as the first conductive layer 19, the metal layer is formed and patterned. Thus the second ground line 33b and third ground line 33c are formed.

Figure 6A:
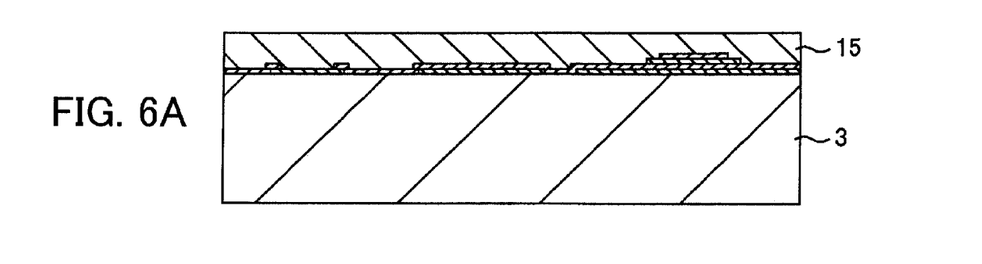
FIG. 6(a) to FIG. 6(c) are cross-sectional views which show a continuation of FIG. 5(d).

After the second conductive layer 23 is formed, as shown in FIG. 6(a), a thin film which becomes the frame 15 is formed. The thin film is formed by adhesion of a film formed by a photosensitive resin or a thin film forming method the same as that for the protective layer 25.

Figure 6B:
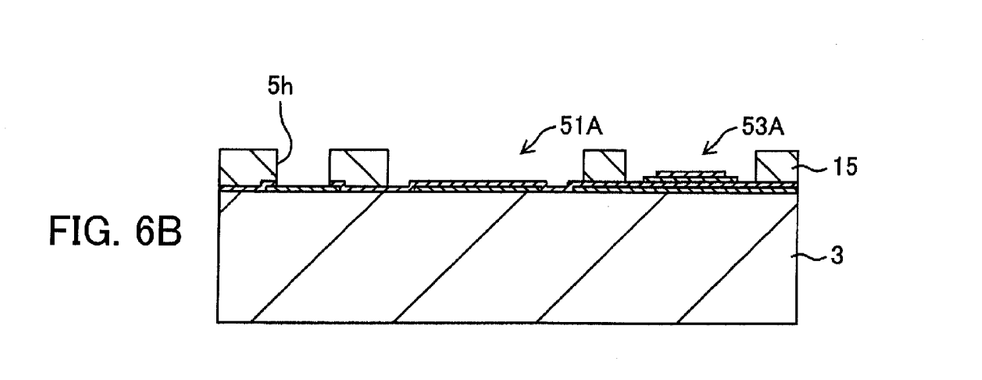

After the thin film which becomes the frame 15 is formed, as shown in FIG. 6(b), by photolithography or the like, portions of the thin film are removed, and openings forming the oscillation spaces 51 and wiring spaces 53 and lower portions of the through holes 5h are formed. That is, the frame 15 is formed from the thin film.

Figure 6C:
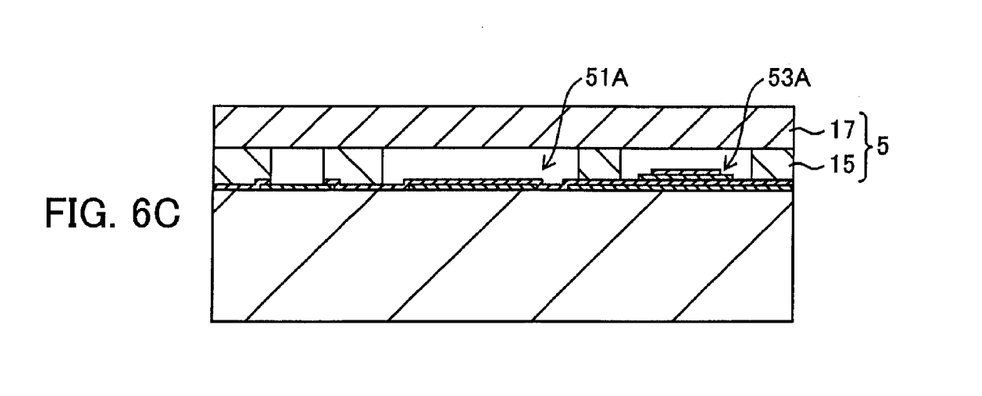

After the frame 15 is formed, as shown in FIG. 6(c), a thin film which becomes the lid 17 is formed. The thin film is formed by for example adhesion of a film of a photosensitive resin. Then, by formation of the thin film, the openings of the frame 15 are closed, whereby the oscillation spaces 51 and wiring spaces 53 are configured.

Figure 7A:
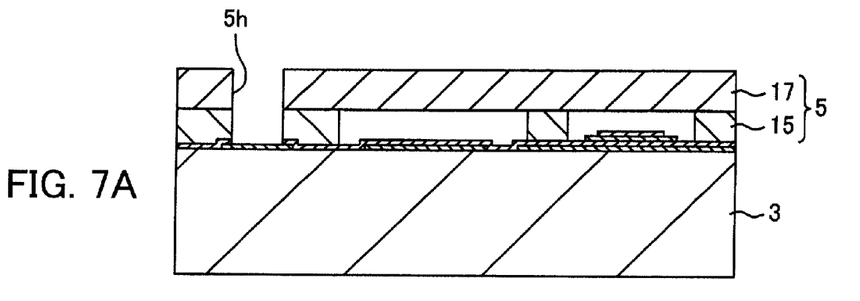
FIG. 7(a) to FIG. 7(c) are cross-sectional views which show a continuation of FIG. 6(c).

After the thin film which becomes the lid 17 is formed, as shown in FIG. 7(a), portions of the thin film are removed by photolithography or the like whereby upper portions of the through holes 5h are formed. That is, the lid 17 is formed from the thin film.

Figure 7B:
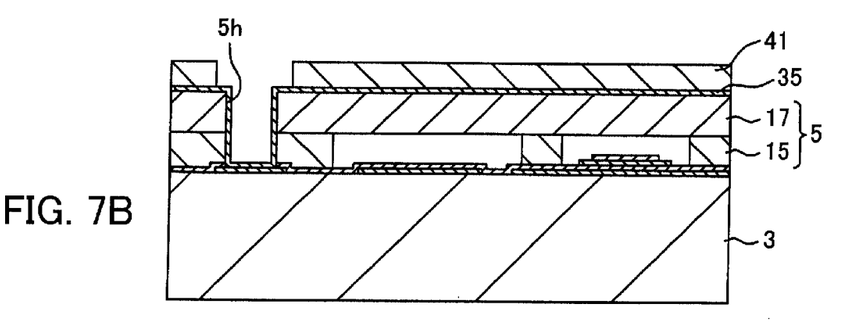

After the lid 17 is formed, as shown in FIG. 7(b), a plating base layer 35 and a resist layer 41 are formed in that order. The plating base layer 35 is formed over the upper surface of the cover 5 and the internal portions of the through holes 5h. The plating base layer 35 is formed by for example laying Ti and Cu and is formed by the sputtering method.

The resist layer 41 is formed so that the plating base layer 35 is exposed in the through holes 5h and their peripheries. Note that, the resist layer 41 is for example formed by forming a thin film of a photosensitive resin by spin coating or the like and patterning that thin film by photolithography.

Figure 7C:
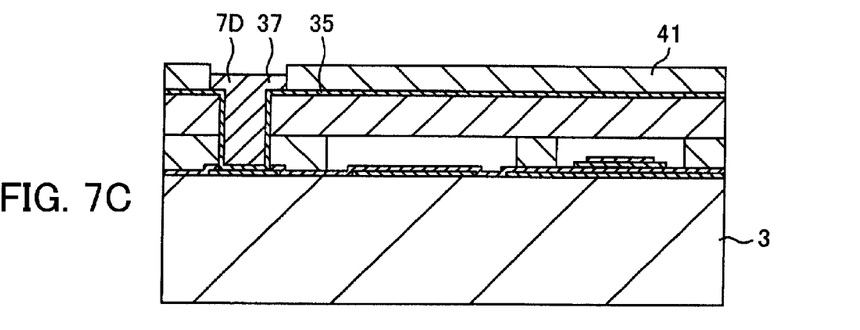

After the resist layer 41 is formed, as shown in FIG. 7(c), the electroplating deposits metal 37 on the exposed portions of the plating base layer 35. The metal 37 is for example Cu. The metal 37 is deposited higher than the top surface of the cover 5.

After that, the portions of the plating base layer 35 which were covered by the resist layer 41 and the resist layer 41 are removed. Thus the terminals 7 comprised of the plating layer 35 and metal 37 are formed. Note that, in FIG. 4, illustration of the plating base layer 35 and metal 37 is omitted. The exposed surfaces of the terminals 7 from the cover 5 may be comprised of nickel, gold, etc. as well.

According to the above embodiment, the SAW device 1 has the substrate 3, SAW elements 10 which are provided on the main surface 3a of the substrate 3, first lines (intermediate lines 29 and output side lines 31) which are provided on the first main surface 3a and are connected to the SAW elements 10, an insulator 21 laid on the first lines, second lines (second ground line 33b and third ground line 33c) which are laid on the insulator 21 and form the three-dimensional wiring parts 39 with the first lines, and the cover 5 which seals the SAW elements 10 and three-dimensional wiring parts 39. Between the first main surface 3a and the cover 5, oscillation spaces 51 which house the SAW elements 10, but do not house the three-dimensional wiring parts 39, and wiring spaces 53 which do not house the SAW elements 10, but house the three-dimensional wiring parts 39 are formed.

Accordingly, the cover 5 is not laid on the three-dimensional wiring parts 39 where relatively large step differences are formed, therefore peeling of the cover 5 from the first main surface 3a and formation of a gap between the cover 5 and the first main surface 3a are suppressed.

If considering only the effect of suppression of peeling of the cover 5 from the first main surface 3a or the effect of suppression of formation of a gap between the cover 5 and the first main surface 3a, the wiring spaces and oscillation spaces may be combined to house the SAW elements 10 and three-dimensional wiring parts 39 in single spaces as well. However, as in the SAW device 1 shown in the embodiment, if the oscillation spaces 51 for housing the SAW elements 10 and the wiring spaces 53 for housing the three-dimensional wiring parts 39 are separately formed isolated from each other, the planar area of each space becomes small, and bending deformation of the lid 17 is suppressed.

Further, the inventors of the present application prepared a SAW device housing the SAW elements 10 and the three-dimensional wiring parts 39 in single spaces and a SAW device housing them in different spaces and compared their electrical characteristics, whereupon they confirmed that a SAW device housing the SAW elements 10 and three-dimensional wiring parts 39 in different spaces was superior in electrical characteristics. The reason for the difference in the electrical characteristics in this way is considered to be that corrosive substances such as chlorine, sulfur or the like are more apt to gather around the three-dimensional wiring parts 39 compared with the other positions on the first main surface 3a and those corrosive substances exerts a big influence upon the SAW elements when the SAW elements 10 and the three-dimensional wiring parts 39 are housed in the same space, while when the SAW elements 10 and the three-dimensional wiring parts 39 are housed in different spaces and those spaces are isolated from each other, the corrosive substances are sealed in the wiring spaces 53, so the influence of corrosive substances upon the SAW elements 10 can be suppressed.

More specifically, the SAW elements 10 are formed in finer patterns compared with the lines, so the influence of corrosion of the SAW elements 10 upon the electrical characteristics of the SAW device 1 is larger compared with the corrosion of the second lines (second ground line 33b and third ground line 33c). Accordingly, it is considered that the electrical characteristics of the SAW device 1 are stabilized by sealing the corrosive substances in the wiring spaces 53 and giving higher priority to the suppression of corrosion of the SAW elements 10 than the suppression of corrosion of the second lines. Therefore, preferably the oscillation spaces 51 and the wiring spaces 53 are formed isolated from each other so that they are air-tightly cut off.

Note that, the reason why the corrosive substances such as the chlorine, the sulfur or the like easily gather around the three-dimensional wiring parts 39 is not necessarily clear. However, for example, it is considered that the photoresist (sulfur) when patterning the second conductive layer 23 is not completely removed, but remains due to the step differences at the three-dimensional wiring parts 39.

The wiring spaces 53 are formed in generally oval shapes in a plan view of the first main surface 3a. In particular, the end portions of the wiring spaces 53 are formed in generally semicircular shapes. In other words, the end portions of the wiring spaces 53 are curved outward in convex shapes. By forming the wiring spaces 53 in such shapes, it is difficult that stress concentration occurs at the inner wall of the cover 5 configuring the end portions of the wiring spaces, so the strength of the cover 5 becomes higher.

The oscillation spaces 51 are formed in shapes like rectangles that the longitudinal directions thereof are the propagation direction of the SAW (X-direction). The three-dimensional wiring parts 39 and wiring spaces 53 are provided relative to the oscillation spaces 51 at the side of the propagation direction (i.e. Y-direction). Accordingly, the spaces as a whole are evenly arranged without being biased in one direction. As a result, in the lid 17, a sharp drop in the strength in a specific direction is suppressed.

Note that, in the above embodiment, the SAW device 1 is one example of the acoustic wave device of the present invention, the SAW elements 10 are one example of the acoustic wave elements of the present invention, the intermediate lines 29 and output side lines 31 are one example of the first lines of the present invention, the second ground line 33*b* and third ground line 33*c* are one example of the second lines of the present invention.

<Second Embodiment>

Figure 8:
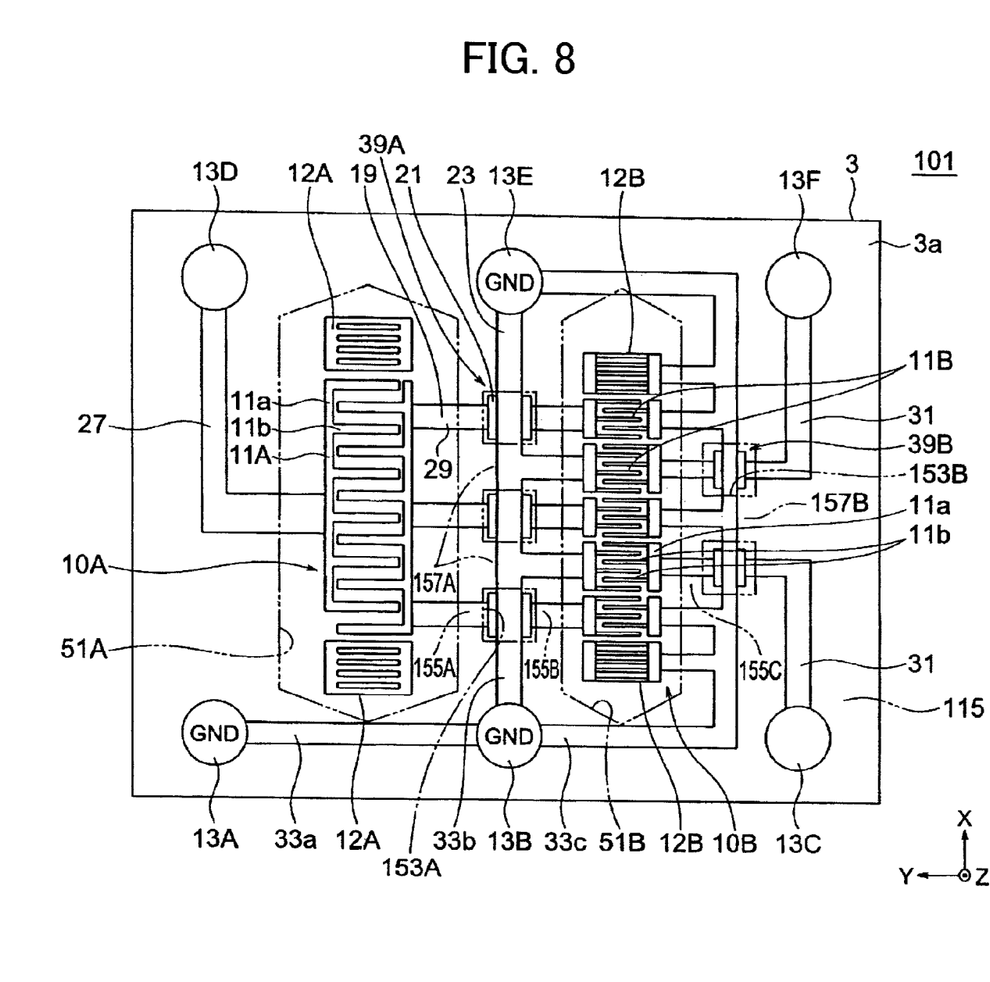
[FIG. 8] A diagrammatical plan view of a SAW device according to a second embodiment.

FIG. 8 is a plan view schematically showing the wiring structure of a SAW device 101 according to a second embodiment of the present invention (view corresponding to FIG. 3). Note that, the planar shape of the frame 115 of the SAW device 101 is generally the same as the shape formed by the outer edge of the substrate 3 and outer edges (two-dot chain lines) of the oscillation spaces and wiring spaces. Therefore, in FIG. 8, the reference sign of the frame 115 is attached too.

The SAW device 101 differs from the SAW device 1 in the first embodiment in only the shape of the frame 115. Specifically, in the SAW device 101, a first wiring space 153A is provided for each of a plurality of first three-dimensional wiring parts 39A. The plurality of first wiring spaces 153A are partitioned by first sub-partition walls 157A which extend in a direction intersecting with (perpendicular to) the propagation direction (X-direction). In the same way, a second wiring space 153B is provided for each of a plurality of second three-dimensional wiring parts 39B. The plurality of second wiring spaces 153B are partitioned by second sub-partition walls 157B which extend in a direction intersecting with (perpendicular to) the propagation direction. Note that, the planar shapes of the wiring spaces 153 are for example rectangular. Note that, corners of the rectangles may be beveled as well.

According to the above second embodiment, the same effects as those by the first embodiment are obtained. That is, the substrate on which the three-dimensional crossing parts are provided can be suitably sealed.

Further, in the SAW device 101, the three-dimensional wiring parts 39 are positioned relative to the SAW elements 10 at the side of the propagation direction of the acoustic wave (i.e., Y-direction). A plurality of these parts are provided along the propagation direction (X-direction). The wiring space 153 is provided for each of the plurality of three-dimensional wiring parts 39. The oscillation spaces 51 and the plurality of wiring spaces 153 are partitioned by main partition walls 155 extending in the propagation direction (X-direction). The plurality of first wiring spaces 153A are partitioned by the sub-partition walls 157 extending in the direction intersecting with the propagation direction.

Accordingly, the sub-partition walls 157 are provided at positions where the SAW elements 10 are divided in the propagation direction of the SAW. Such sub-partition walls 157 end up blocking the propagation of the SAW if they are provided over the SAW elements 10 (in oscillation spaces 51). Further, by the sub-partition walls 157, the support points of the lid 17 in the propagation direction of the SAW increase, so the strength is effectively improved.

<Third Embodiment>

Figure 9:
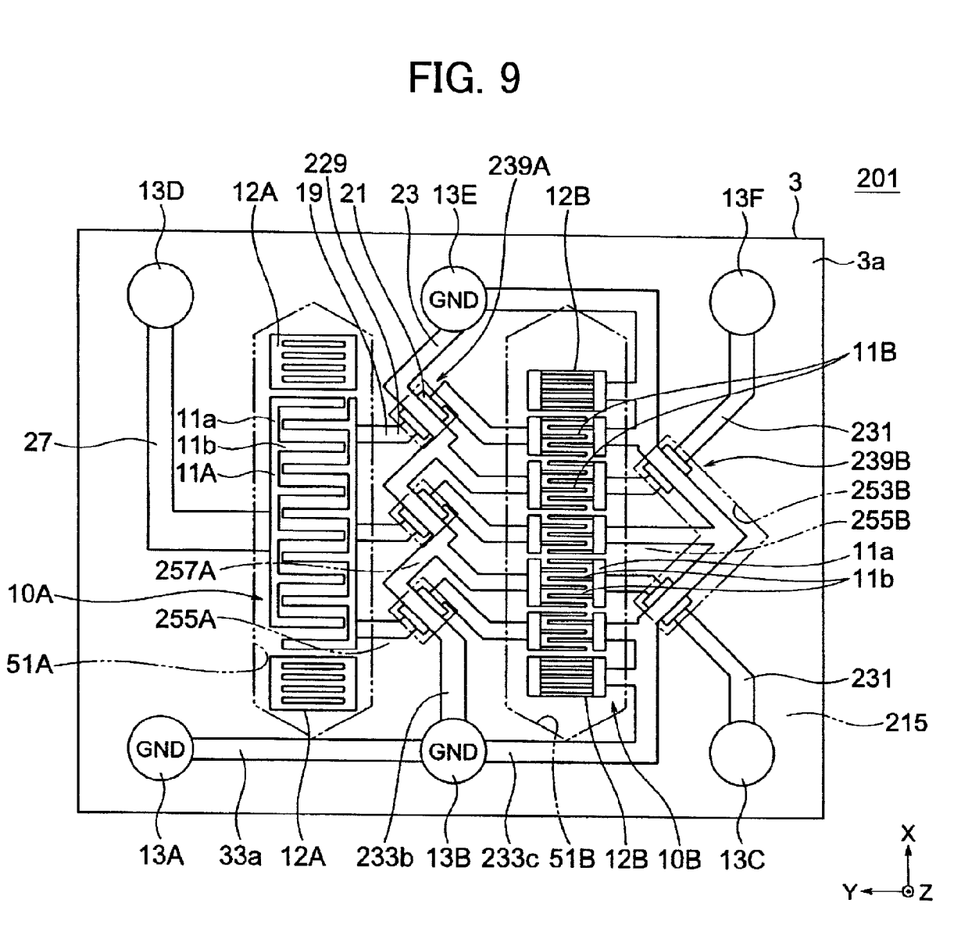
[FIG. 9] A diagrammatical plan view of a SAW device according to a third embodiment.

FIG. 9 is a plan view schematically showing the wiring structure of a SAW device 201 according to a third embodiment of the present invention (view corresponding to FIG. 3). Note that, in FIG. 9, in the same way as FIG. 8, the reference sign of the frame 215 is attached too.

In the SAW device 201, at the first three-dimensional wiring parts 239A, intermediate lines 229 and a second ground line 233*b* extend in directions inclined relative to the propagation direction of the SAW (X-direction). In the same way, at the second three-dimensional wiring parts 239B, output side lines 231 and a third ground line 233*c* extend in directions inclined relative to the propagation direction of the SAW.

A first wiring space 253A is provided for each of the plurality of first three-dimensional wiring parts 239A in the same way as the second embodiment. Inner walls of the plurality of first wiring spaces 253A extend along the direction in which the intermediate lines 229 and second ground line 233*b* extend. That is, the inner walls are inclined relative to the propagation direction of the SAW (X-direction). Note that, due to this, in the first main partition wall 255A, a thick portion and a thin portion are formed. Further, the first sub-partition walls 257A extend with inclination relative to the propagation direction of the SAW (X-direction).

Each second wiring space 253B houses a plurality of second three-dimensional wiring parts 239B together in the same way as the first embodiment. Inner walls of the second wiring space 253B extend along the directions in which the output side lines 231 and third ground line 233*c* extend. That is, the inner walls are inclined relative to the propagation direction of the SAW (X-direction). Note that, due to this, in the second main partition wall 255B, a thick portion and a thin portion are formed.

According to the above third embodiment, the same effects as those by the first embodiment are obtained. That is, a substrate on which the three-dimensional crossing parts are provided can be suitably sealed.

Further, in the three-dimensional wiring parts 239, the lines extend in directions inclined relative to the propagation direction of the SAW (X-direction), and the inner walls configuring the wiring spaces 253 are formed along the inclination directions. Accordingly, it becomes possible to improve the strength of the cover 5 in directions inclined relative to the propagation direction of the SAW. Note that, the inner walls configuring the wiring spaces 253 do not always have to be formed parallel to the inclination directions and may be formed along directions which are a bit deviated from the directions parallel to the inclination directions as well. The oscillation spaces are formed in generally rectangular shapes having sides parallel to the propagation direction of SAW in many cases. In such a case, the directions inclined relative to the propagation direction become diagonal lines of the rectangles of the oscillation spaces, so the distance between the supporting points of the lid 17 becomes longer. However, according to the second embodiment, the strength in such directions can be improved. Accordingly, an overall improvement of the strength is achieved.

Further, there are fewer portions where the oscillation spaces and the wiring spaces are close. Therefore, there is also the advantage that the possibility of connection of the oscillation spaces and the wiring spaces due to peeling of the main partition walls between them becomes low.

<Fourth Embodiment>

Figure 10:
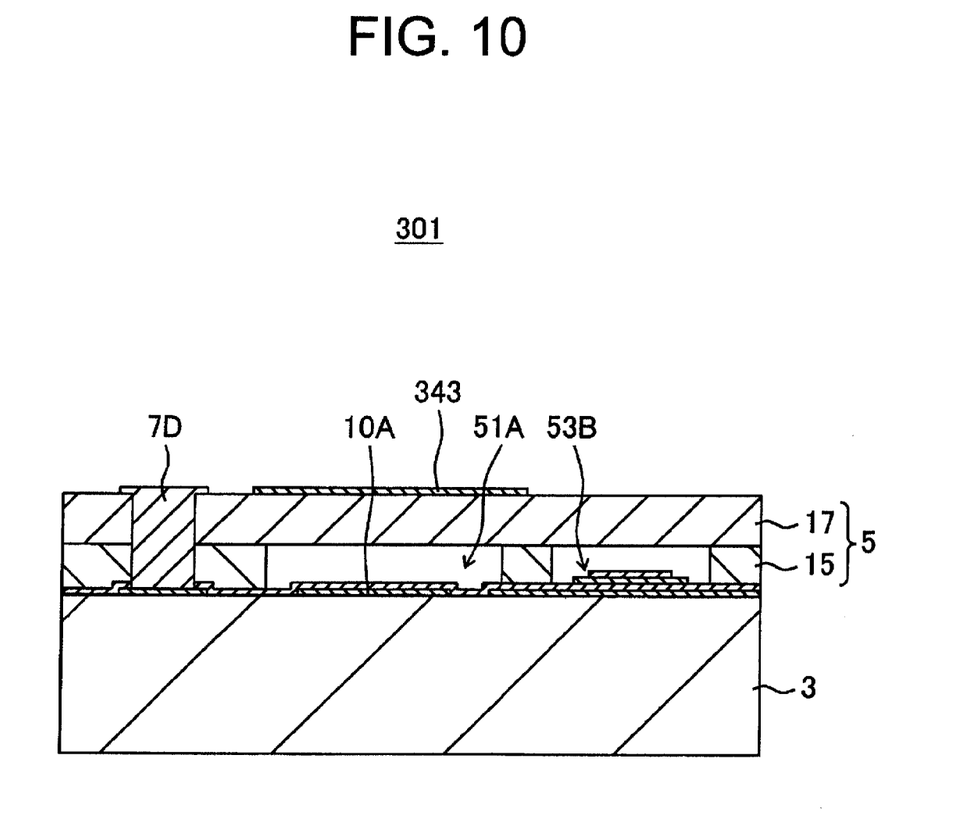
[FIG. 10] A cross-sectional view of a SAW device according to a fourth embodiment.

FIG. 10 is a cross-sectional view of a SAW device 301 according to a fourth embodiment of the present invention (view corresponding to FIG. 4).

The SAW device 301 differs from that in the first embodiment only in the point that a metal layer 343 is provided on the top surface of the cover 5. The metal layer 343 is provided in a range that overlaps the oscillation spaces 51, but does not overlap the wiring spaces 53. Note that, the metal layer 343 is preferably formed so as to overlap the entire oscillation spaces 51. Although particularly not shown, the metal layer 343 extends up to the positions of the terminals 7 (first terminal 7A, second terminal 7B, and fifth terminal 7E in the present embodiment) connected to the reference potential and is connected to these terminals 7.

The metal layer 343 is made of for example Cu and can be prepared by plating in the same process as the formation of the terminals 7. In other words, the metal layer 343 may be configured by a plating base layer 35 and a metal 37. The thickness of the metal layer 343 is for example 1 μm to 50 μm.

According to the above fourth embodiment, in addition to the effects of the first embodiment, the effect of suppression of bending deformation of the lid 17 by the metal layer 343 is obtained. The metal layer 343 overlaps the oscillation spaces 51 requiring air-tightness more than the wiring spaces 53, but does not overlap the wiring spaces 53, therefore the strength can be effectively reinforced with a small area. As a result, for example, ensuring a wide area of the lands 7b of the terminals 7 and so on are facilitated. Further, when a large pressure is applied to the lid 17 in a case where the SAW device 301 is transfer molded by resin or the like, the portions in the lid 17 which are positioned above the wiring spaces 53 and do not have the metal layer 343 warp more easily than the portions above the oscillation spaces 51 at which the metal layer 343 is provided. Due to warping of the portions in the lid 17 above the wiring spaces 53 in this way, the wiring spaces 53 are crushed a bit. Then, it is expected that pressure from the lateral direction is applied to the oscillation spaces 51 positioned adjacent to the wiring spaces 53, the atmospheric pressure between the cover 5 and the substrate 3 becomes higher in the oscillation spaces 51, and warping of the lid 17 above the oscillation spaces 51 is suppressed. Note that, even when the wiring spaces 53 warp, there is almost no influence exerted upon the characteristics of the SAW device 301.

The present invention is not limited to the above embodiments and modifications and may be worked in various ways.

The acoustic wave device is not limited to the narrow sense of a SAW device. For example, the acoustic wave device may be a film bulk acoustic resonator as well. Further, for example, the acoustic wave device may be a boundary acoustic wave device (included in SAW devices in a broad sense) as well. In other words, an oscillation space does not have to be provided either. Note that, in this case, a medium layer on the piezoelectric substrate for propagating the boundary acoustic wave or the medium layer and a sound absorption layer laid over that according to need may be regarded as the cover or a portion of the cover in the invention of the present application. Further, various shapes of the wiring spaces disclosed in the embodiments may be naturally employed even in a case where an oscillation space is not provided. The SAW device in a broad sense is not limited to a so-called duplex mode type and may be a ladder or another type as well.

In the acoustic wave device, the protective layer 25 may be omitted as well. Conversely, another suitable layer etc. may be formed as well. For example, a connection reinforcement layer interposed between the pad 13 and the terminals 7, a conductive layer formed between the frame 15 and the lid 17, and an electrode or protective layer which is laid on a main surface opposite to the cover of the substrate may be provided as well.

The oscillation spaces and the wiring spaces do not have to be air-tightly cut off either. For example, connecting holes may be provided at portions of the main partition walls partitioning the oscillation spaces and the wiring spaces as well. Even in this case, the effect of reinforcement of the strength is obtained, and a suppression of movement of corrosive substances to the oscillation spaces is possible to a certain extent.

The metal layer may be provided so as to overlap not only the oscillation spaces, but also the entire wiring spaces as well. Further, the metal layer may exhibit an electrically floating state without connection to the terminals given the reference potential as well.

REFERENCE SIGNS LIST

1 . . . surface acoustic wave device (acoustic wave device), 3 . . . substrate, 3a . . . first main surface (main surface), 5 . . . cover, 11 . . . SAW element, 21 . . . insulator, 29 . . . intermediate line (first line), 33b . . . second ground line, 39 . . . three-dimensional wiring part, 51 . . . oscillation space, and 53 . . . wiring space.

The invention claimed is:

1. An acoustic wave device, comprising:
   a substrate,
   an acoustic wave element on a main surface of the substrate,
   a first line on the main surface and which is connected to the acoustic wave element,
   an insulator on the first line,
   a second line on the insulator and which comprises at least one three-dimensional wiring part which crosses three-dimensionally the first line via the insulator, and
   a cover which seals the acoustic wave element and the three-dimensional wiring part with the main surface, wherein
   at least one wiring space housing the three-dimensional wiring part and at least one oscillation space housing the acoustic wave element are located between the main surface and the cover, and
   the oscillation space and the wiring space are isolated from each other.

2. The acoustic wave device according to claim 1, wherein:
   the oscillation space has a rectangular shape that a longitudinal direction thereof is a propagation direction of an acoustic wave, and
   the three-dimensional wiring part and the wiring space are located apart from the oscillation space in a short direction of the oscillation space.

3. The acoustic wave device according to claim 1, wherein:
   a plurality of the three-dimensional wiring parts are located next to the acoustic wave element in a direction intersecting with a propagation direction of an acoustic wave, and are provided along the propagation direction,
   a plurality of the wiring spaces are provided for each of the plurality of the three-dimensional wiring parts, and
   the cover comprises a main partition wall extending in the propagation direction which is interposed between the oscillation space and the plurality of wiring spaces and partition the two types of spaces and a sub-partition wall extending in the direction intersecting with the propagation direction which is interposed between the plurality of wiring spaces and partition the wiring spaces.

4. The acoustic wave device according to claim 1, wherein:
   in the three-dimensional wiring part, the first line and the second line extend in directions inclined relative to a propagation direction of an acoustic wave, and
   inner walls of the wiring space are formed along the inclined directions.

5. The acoustic wave device according to claim 1, further comprising a metal layer which is located above the cover and is provided in a range that overlaps the oscillation space, and does not overlap the wiring space in a plan view.

6. The acoustic wave device according to claim 1, wherein an end portion of the wiring space are curved outward in convex shapes in a plan view of the main surface.

7. The acoustic wave device according to claim 1, wherein the first line is for transmitting an input signal to the acoustic wave element or an output signal from the acoustic wave element, and
   the second line is given a reference potential.

8. The acoustic wave device according to claim 7, wherein the second line is thicker than the first line.

9. The acoustic wave device according to claim 1, wherein:
the at least one three-dimensional wiring part comprises a plurality of the three-dimensional wiring parts, and
one of the at least one wiring space houses the plurality of three-dimensional wiring parts.

10. The acoustic wave device according to claim 9, wherein the plurality of the three-dimensional wiring parts are aligned along a propagation direction of an acoustic wave.

11. The acoustic wave device according to claim 1, further comprising:
a third line on the main surface and which is connected to the acoustic wave element,
a second insulator on the third line, and
a fourth line on the second insulator and which comprises at least one second three-dimensional wiring part which crosses three-dimensionally the third line, wherein
the cover seals the second three-dimensional wiring parts,
a second wiring space which is isolated from the wiring space and the oscillation space and houses the second three-dimensional wiring part is located between the main surface and the cover, and
the wiring space, the oscillation space, and the second wiring space are arranged in that order in a direction intersecting with a propagation direction of an acoustic wave.

12. The acoustic wave device according to claim 11, wherein:
the at least one three-dimensional wiring part comprises a plurality of the three-dimensional wiring parts and the second three-dimensional wiring parts,
one of the at least one wiring space houses the plurality of the three-dimensional wiring parts,
the second wiring space houses the plurality of the second three-dimensional wiring parts, and
the number of the three-dimensional wiring parts which are housed in the wiring space and the number of the second three-dimensional wiring parts which are housed in the second wiring space are different.

13. The acoustic wave device according to claim 11, wherein the length of the wiring space in the propagation direction of the acoustic wave is different from the length of the second wiring space in the propagation direction of the acoustic wave.

14. A filtering device for filtering a signal, the filtering device comprising:
the acoustic wave device according to claim 1; and
a circuit board on which the acoustic wave device is mounted.

15. An acoustic wave device comprising:
a substrate;
an acoustic wave element on a main surface of the substrate;
at least one line on the main surface, the at least one line comprising a first portion; and
a cover which covers the acoustic wave element and the line,
wherein at least one first space which houses the first portion, but does not house the acoustic wave element, is located between the main surface and the cover,
wherein the at least one line comprises a first line and a second line comprising at least one three-dimensional wiring part which crosses three-dimensionally with the first line, and
wherein the at least one first space houses the three-dimensional wiring part.

16. The acoustic wave device according to claim 15, wherein:
at least one three-dimensional wiring part comprises a plurality of the three-dimensional wiring parts, and
one of the at least one first space houses the plurality of three-dimensional wiring parts.

17. The acoustic wave device according to claim 16, wherein the plurality of the three-dimensional wiring parts are aligned along a propagation direction of an acoustic wave.

18. An acoustic wave device comprising:
a substrate;
an acoustic wave element on a main surface of the substrate;
at least one line on the main surface, the at least one line comprising a first portion; and
a cover which covers the acoustic wave element and the line,
wherein at least one first space which houses the first portion, but does not house the acoustic wave element, is located between the main surface and the cover, and
wherein the first portion comprises a first part closer to an inner circumference of the first space than a second part, and the second part thicker than the first part.

19. The acoustic wave device according to claim 18, wherein the at least one first space is located apart from the acoustic wave element in a direction intersecting with a propagation direction of an acoustic wave.

20. The acoustic wave device according to claim 18, further comprising a metal layer located at the cover.

21. The acoustic wave device according to claim 18, further comprising:
at least one opposite side line on the main surface,
wherein
the acoustic wave element is located between one of the at least one opposite side line and one of the at least one line in a direction intersecting with a propagation direction of an acoustic wave,
the cover covers the opposite side line,
a second space which houses a portion of the opposite side line is located between the cover and the main surface, and
the first space, the acoustic wave element, and the second space are arranged in that order in the direction intersecting with the propagation direction of the acoustic wave.

22. An acoustic wave device, comprising:
a substrate;
an acoustic wave element on a main surface of the substrate;
at least one line on the main surface, the at least one line comprising a first portion;
at least one opposite side line on the main surface; and,
a cover which covers the acoustic wave element, the at least one line and the at least one opposite side line,
wherein at least one first space which houses the first portion, but does not house the acoustic wave element is located between the main surface and the cover,
wherein the acoustic wave element is located between one of the at least one opposite side line and one of the at least one line in a direction intersecting with a propagation direction of an acoustic wave,
wherein a second space which houses a portion of the at least one opposite side line is located between the cover and the main surface, wherein the first space, the acoustic wave element, and the second space are arranged in that order in the direction intersecting with the propagation direction of the acoustic wave, and, wherein a length of the first space in the propagation direction of the acoustic wave is different from a length of the second space in the propagation direction of the acoustic wave.

23. The acoustic wave device according to claim 22, wherein the first portion comprises a part thicker than an electrode of the acoustic wave element.

24. The acoustic wave device according to claim 22, wherein:
 at least one oscillation space which houses the acoustic wave element is located between the main surface and the cover, and
 the at least one oscillation space and the first space are isolated from each other.

25. A filtering device for filtering a signal, the filtering device comprising:
 the acoustic wave device according to claim 22 ; and
 a circuit board on which the acoustic wave device is mounted.

26. An acoustic wave device comprising:
 a substrate;
 an acoustic wave element on a main surface of the substrate;
 at least one line on the main surface, the at least one line comprising a first portion; and
 a cover which covers the acoustic wave element and the at least one line,
 wherein
  at least one first space which houses the first portion, but does not house the acoustic wave element, is located between the main surface and the cover,
  the acoustic wave element comprises an electrode, and
  sulfur or chlorine is deposited upon the first portion in a larger amount than those upon the electrode.

27. An acoustic wave device comprising:
 a substrate;
 an acoustic wave element on a main surface of the substrate;
 at least one line on the main surface, the at least one line comprising a first portion;
 at least one opposite side line on the main surface; and
 a cover which covers the acoustic wave element, the at least one line and the at least one opposite side line,
 wherein at least one first space which houses the first portion, but does not house the acoustic wave element, is located between the main surface and the cover,
 wherein the at least one line comprises a first line and a second line comprising at least one three-dimensional wiring part which crosses three-dimensionally with the first line,
 wherein the at least one first space houses the at least one three-dimensional wiring part,
 wherein the at least one first space is located apart from the acoustic wave element in a direction intersecting with a propagation direction of an acoustic wave,
 wherein the acoustic wave element is located between one of the at least one opposite side line and one of the at least one line in the direction intersecting with the propagation direction of the acoustic wave,
 wherein a second space which houses a portion of the opposite side line is located between the cover and the main surface, and
 wherein the at least one first space, the acoustic wave element, and the second space are arranged in that order in the direction intersecting with the propagation direction of the acoustic wave.

* * * * *